United States Patent [19]

Schwuttke et al.

[11] 4,018,626
[45] Apr. 19, 1977

[54] IMPACT SOUND STRESSING FOR SEMICONDUCTOR DEVICES

[75] Inventors: Guenter H. Schwuttke, Poughkeepsie; Kuei-Hsiung Yang, Wappingers Falls, both of N.Y.

[73] Assignee: International Business Machines Corporation, Armonk, N.Y.

[22] Filed: Sept. 10, 1975

[21] Appl. No.: 612,164

[52] U.S. Cl. .............................. 148/1.5; 148/186; 148/187; 148/175

[51] Int. Cl.² .............. H01L 21/304; H01L 21/322

[58] Field of Search ............ 148/1.5, 186, 187, 175

[56] References Cited

UNITED STATES PATENTS

| | | | |
|---|---|---|---|
| 2,840,495 | 6/1958 | Treuting | 148/1.5 |
| 3,215,568 | 11/1965 | Pfann | 148/33 |
| 3,320,103 | 5/1967 | Drake et al. | 148/186 X |
| 3,396,456 | 8/1968 | Weinstein | 148/187 X |
| 3,622,382 | 11/1971 | Brack et al. | 148/1.5 |

Primary Examiner—G. Ozaki
Attorney, Agent, or Firm—Sughrue, Rothwell, Mion, Zinn & Macpeak

[57] ABSTRACT

Methods of making semiconductor devices using the technique of impact sound stressing are disclosed. Impact sound stressing (ISS) is a mechanical acoustical technique to damage, in a known and controlled manner, semiconductor wafers. Wafers are subjected to ISS on the backsides before semiconductor processing steps. The application of ISS before the first high temperature application will control the generation and subsequent direction of flow (gradient) of vacancies (interstitials) generated through all device high temperature processing steps including ion implantation. ISS redirects the flow of vacancies/interstitials into the backside away from the device area of the wafer. Thus, the device area is swept clean in a gettering action of vacancy/interstitials and their complexes which are detrimental to device performance. The technique of impact sound stressing finds application in improving the performance of all semiconductor devices, specifically dynamic memories, bipolars, solar cells and power devices.

11 Claims, 3 Drawing Figures

IMPACT SOUND STRESSING FOR SEMICONDUCTOR DEVICES

BACKGROUND OF THE INVENTION

This invention is related to U.S. patent application entitled "Impact Sound Stressing for Semiconductors", applicants G. H. Schwuttke and E. Gorey, assigned to the same assignee herein and filed on June 30, 1975, Ser. No. 591,922.

FIELD OF THE INVENTION

This invention relates to a method of making semiconductors.

PRIOR ART

The fabrication of semiconductor devices involves the application of high temperatures to silicon wafers, and this step is known to provide stresses across or through the wafer. The relief of stresses, thereby controlling the generation and subsequent direction of flow of vacancies (interstitials) in the lattice structure, has been a subject of interest in the prior art. The mechanical damaging of a wafer surface has been proposed as a means of "gettering" impurities within a wafer. It has been recognized that if the surface, generally opposite the side where device processing will occur, is appropriately damaged, the gettering effect will sweep the device area clean of vacancy/interstitials and their complexes including stacking faults and dislocations which are detrimental to device performance. While the problem has been defined, the solutions to-date have been unsatisfactory. For example, Netz in *J. Electro Chemical Society*, 112, 420 (1965) suggests the application of sand blasting as a technique of inducing backside surface damage to improve semi-conductor yields. This technique has not found practical application because non-uniform results in terms of damage patterns are the inevitable consequence of sandblasting. Also, Lawrence in *Semiconductor Silicon* —1973, p. 17, references a gettering technique by means of generating fresh lattice damage as a result of mechanical lapping. This proposal is also not useful in a manufacturing system because the results are not easily reproduced and it cannot be applied on a volume basis to a large number of wafers.

In addition to these difficulties, the primary shortcoming in the prior art is that the degree of damage in terms of depth cannot be controlled. As a result, dislocations created on wafer backsides by mechanical action propagate through the wafer upon high temperature application onto the device surface, thus destroying the device. Hence, while improvement in yield ratios was predicated analytically, inconsistent and disappointing results are the practical consequences of these prior art techniques. As a result, semiconductor technology has not been able to provide the wafer manufacturer with a reliable technique of improving yield ratios.

A related problem in the prior art is the generation of a high density of oxidation-induced stacking faults in epitaxial silicon. It has generally been assumed that epitaxial silicon was free from mechanical damage; however, recent experiments [C. M. Drum and W. van Gelder, *J. Appl. Phys.*, 43, 11, 4465 (1972); C. M. Hsieh and D. M. Maher, *J. Appl. Phys.*, 44, 3, 1302 (1973)] have, using preferential etching of the oxidized epitaxial demonstrated the existence of stacking faults in the structure. The generation lifetime of the epitaxial layers is in most cases several orders of magnitude lower than that of CZ-grown substrates [P. Rai-Choudhury and D. K. Schroder, *J. Electrochem. Soc.*, 119, 11, 1580 (1972)]. These experiments have also pointed out that in spite of high structural perfection of epitaxial silicon, p-n junctions involving epitaxial silicon give either high-reverse leakage current or exhibit considerably lower junction breakdown voltage than diffused junctions in CZ-grown silicon. Improvement in the generation lifetimes of these devices is an important consideration and heretofore iodine etching before epitaxial processing was a common technique to remove a portion of the silicon surface. Etching is, however, an expensive and time consuming process and does not guarantee the desired improvement in epitaxial layer perfection.

SUMMARY OF THE INVENTION

This invention uses the technique of impact sound stressing (ISS) as an integral processing step in the production of semiconductor devices. Impact sound stressing, in its most basic form, involves the acoustic vibration of spherical objects on the wafer surface to mechanically damage the wafer. In the related application of Schwuttke and Gorey; cited above, the basic structure and analysis of impact sound stressing is presented. That application uses impact sound stressing to produce, in a known and duplicative manner, damage to the surface of silicon to study and predict the effects of stacking faults, dislocations, etc., on device processing. In particular, Schwuttke and Gorey use impact sound stressing as a laboratory tool for the accurate analysis of the physical properties of semiconductors by imparting uniform damage to the wafer surface designated for device processing.

This invention uses impact sound stressing as an integral process step in the fabrication of semiconductor devices. The use of ISS on the backside of wafers, that is, the side opposite the one onto which devices will be applied, serves to create a gettering effect in the crystal which redirects the flow of interstitials (vacancies) which are generated throughout all device high temperature processing steps. The re-direction of this flow into the backside of the wafer "sweeps" the device area clean of interstitials (vacancies). As a result, lifetime in the device area is improved and pipe formation in the presence of multiple junctions is minimized.

Accordingly, it is an object of this invention to provide a method for improving semiconductor performance by the use of impact sound stressing.

It is another object of this invention to provide a technique for achieving the uniform damaging of wafer backsides to control the generation and movement of interstitials (vacancies) in the wafer during high temperature processing.

It is yet another object of this invention to provide a reliable and reproducible means of damaging wafers without subsequent propagation of damage during high temperature processing.

Still another object of this invention is the creation of a new class of semiconductor substrates having uniform backside damage.

These and other objects of the invention and a full understanding may be had by referring to the following description and claims taken in conjunction with the accompanying drawings.

DETAILED DESCRIPTION OF THE PREFERRED EMBODIMENTS

The basic implementation of impact sound stressing is disclosed in the related application of Schwuttke and Gorey and the structure need not be described here. Essentially, the technique involves the placement of a wafer in an acoustical relationship with a loudspeaker and a series of pellets, normally of spherical configuration, are placed on the surface to be damaged. The loudspeaker is driven at a suitable power level and frequency, usually the resonant frequency of the wafer, causing the wafer to vibrate in a harmonic mode. As a consequence, the pellets bounce on the surface, the magnitude of the bouncing being a function of the power level. The pellets are typically tungsten about 300 $\mu$m in diameter, and any convenient number may be used. By varying the time, power and number of pellets, uniform and reproducible damage patterns can be created. The damage is in the form of Hertzian fracture cones and microsplits. These damage patterns result in increased device lifetimes by the creation of interstitials (vacancies) toward the damaged side of the wafer, away from the device area.

Figure 1A:
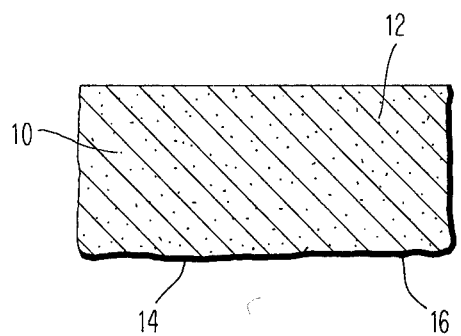
FIGS. 1A, 1B and 1C show a schematic series of wafer sections portraying the basic steps of this invention.
Figure 1B:
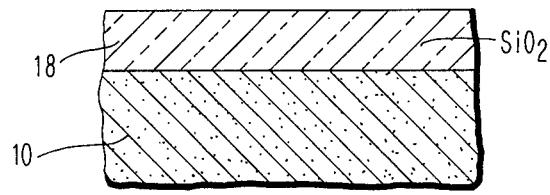
Figure 1C:
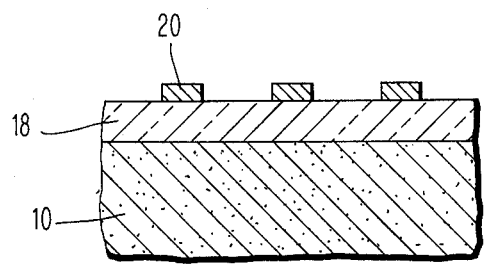

Referring now to FIGS. 1A, 1B and 1C, the basic method is shown in three stages. In FIG. 1A, the wafer 10, typically silicon, has a polished surface 12 upon which the particular semiconductor device is to be fashioned and an opposite or backside 14. On the backside, impact sound stressing is performed to create a uniform pattern of damage shown out of proportion as 16. Because ISS damage serves as a stress relief agent during processing, this step must be carried out prior to high temperature processing. As shown in FIG. 1B, this step is shown as the oxidation of silicon such as at 18; however, other high temperature operations such as epitaxy, diffusion or ion implantation of silicon and other semiconductor materials are obviously included. The final step of the device application is shown in FIG. 1C, and is the deposition of aluminum metallurgy 20 to form basic MOS capacitors in the wafer and is only one typical application.

The following examples demonstrate, by comparative test value, the utility of this invention.

EXAMPLE 1

A series of Si wafers were sound stressed on the backside by bouncing tungsten balls (12 mils in diameter) under the following parameters:
 a. Power — 40 watts
 b. Frequency —1.38 kHz
 c. Time — 5 min.

As a result of the sound stressing, a high density ($10^5/cm^2$) of Hertzian cracks and damage clusters form on the wafer backside. The wafers were then precleaned by Huang-HF(7.5 min) — Huang cleaning and MOS capacitors made on the samples. Comparative runs, measuring yields with control samples were:

|    | Substrate | Backside Stressed | No. of Wafers | Range, MOS Yield % | Ave., MOS Yield % |
|----|-----------|-------------------|---------------|--------------------|--------------------|
| 1. | Control p <100> 2Ω - cm | — | 4 | 76–100 | 92.6 |
| 2. | Standard p <100> 2Ω - cm | Yes | 4 | 94.5–100 | 98.6 |
| 3. | Standard p <100> 2Ω - cm | Yes | 5 | 80.6–100 | 91.2 |
| 4. | " | No | 2 | 25–25 | 25 |
| 5. | " | Yes | 3 | 80.6–97 | 87.9 |
| 6. | " | No | 2 | 30.6–36.2 | 33.4 |
| 7. | " | Yes | 3 | 80.6–97 | 91.7 |
| 8. | Standard p <100> 15Ω - cm | Yes | 7 | 86.3–100 | 93.8 |
| 9. | Standard n <100> 1Ω - cm | No | 6 | 8.5–60 | 37.3 |
| 10. | " | Yes | 10 | 61.3–81.3 | 70.5 |

The results can be summarized by:

1. Stressing the backside of the high quality control wafer did not show any degradation of the wafers, but improvements with a narrower range of MOS yield was observed.

2. Backside stressing resulted in remarkable improvement in the MOS yield of Standard wafers. All Standard p-type wafers measured after stressing have a yield of 80% or more with an average yield of about 90%. In order to insure that improvement was not as a result of chance in the samples, non-stressed and stressed tail end wafers (samples 4–7) were processed simultaneously. The improvement is self-evident in samples 6–7 which were reject wafers.

EXAMPLE 2

A comparative test using various treatments, such as $I_2$ etch, subcollector diffusion into five squares (i.e. 5 □ ) and sound stressing of substrate backsides were used to see if any improvement of epitaxial quality can be achieved. An n-epi layer was grown on p <100> substrates (15 Ω cm) by the hydrogen reduction of $SiCl_4$ at 1100° C. The thickness of the n-eptiaxial layer was about 6 $\mu$ and the dopant (As) concentration ranged from 0.8 to 1.6 × $10^{16}$ atoms/cc as calculated from the C-V measurements of MOS capacitors.

In one run, some wafers were $I_2$ etched to remove 1 $\mu$ of surface before epitaxial processing. In another run, the substrates were subjected to two different treatments before epitaxial deposition. Impact sound stressing of substrate backsides was carried out by bouncing tungsten balls (12 mils in diameter) on the backside of the wafers at 40 watts power and 1.38 kHz for 5 minutes. For the 5 ▢ test, the wafers were oxidized and had subcollector diffusion in the five squares and subcollector reoxidation.

Following epitaxial deposition, MOS capacitors with 1400 A-thick dry oxide were made in the n-epi layer, and the C-V curves of the capacitors measured.

RESULTS

Effect of $I_2$-etch on the Lifetime of N-Epitaxial Silicon

RESULTS

Effect of $I_2$-etch on the Lifetime of N-Epitaxial Silicon

| Substrate | | $I_2$ Etch | Lifetime, $\mu s$ | Ave. Lifetime, $\mu s$ |
|---|---|---|---|---|
| Standard | 1 | No | 0.076 ~ 0.38 | 0.19 |
| | 3 | " | 0.18 ~ 0.89 | 0.58 |
| | 5 | " | 0.016 ~ 0.56 | 0.22 |
| | 7 | " | 0.12 ~ 0.051 | 0.038 |
| | | | | 0.26 |
| Standard | 2 | Yes | 0.50 ~ 3.11 | 1.09 |
| | 4 | " | 0.21 ~ 2.96 | 0.83 |
| | 6 | " | 0.34 ~ 7.31 | 2.91 |
| | 8 | " | 0.27 ~ 1.75 | 0.75 |
| | | | | 1.40 |
| Selected | A | No | 0.60 ~ 18.0 | 8.48 |
| | C | " | 0.26 ~ 3.51 | 1.51 |
| | E | " | 0.044 ~ 5.28 | 2.52 |
| | G | " | 0.036 ~ 0.36 | 0.14 |
| | | | | 3.16 |
| Selected | B | Yes | 0.054 ~ 3.73 | 1.21 |
| | D | " | 1.005 ~ 2.42 | 1.23 |
| | | | | 1.22 |
| Standard 5 ▢ | | No | 0.48 ~ 143.6 | 43.0 |
| Control | 140-1 | No | 15 ~ 286.2 | 107.2 |
| | 141-1 | epitaxial | 162-638 | 441.3 |
| | 142-2 | " | 27-131 | 63.3 |
| | | | | 206 |

Effect of 5 ▢ and Backside Sound-Stressing on the Lifetime of N-Epitaxial Silicon

| Substrate | | Backside Stressed | Lifetime, $\mu s$ | Ave. Lifetime, $\mu s$ |
|---|---|---|---|---|
| Standard 5 ▢ 1 | | No | 0.38 ~ 2.94 | 1.10 |
| | 2 | No | 0.063 ~ 0.73 | 0.32 |
| | 3 | No | 0.04 ~ 1.46 | 0.39 |
| | 4 | No | 9.93 ~ 53.9 | 25.9 |
| | 5 | No | 0.12 ~ 4.55 | 1.02 |
| | | | | 5.75 |
| Standard | 1 | Yes | 0.64 ~ 6.81 | 2.47 |
| | 2 | " | 2.87 ~ 12.9 | 7.56 |
| | 3 | " | 25.8 ~ 93.5 | 53.6 |
| | 4 | " | 0.68 ~ 7.66 | 3.93 |
| | 5 | " | 0.016 ~ 2.02 | 1.14 |
| | | | | 13.7 |
| Selected | A | Yes | 0.19 ~ 14.3 | 6.29 |
| | B | " | 10.3 ~ 60.7 | 32.2 |
| | C | " | 0.17 ~ 14.7 | 8.50 |
| | D | " | 11.4 ~ 43.5 | 23.7 |
| | E | " | 5.74 ~ 9.38 | 7.09 |
| | | | | 15.6 |
| Control | 148-1 | No | 363 ~ 488 | 359 |
| | 149-1 | epitaxial | 433 ~ 712 | 558 |
| | 150-1 | " | 43.4 ~ 108 | 80.5 |
| | | | | 332.5 |

A comparison with the values on the two charts indicates the importance of impact sound stressing as compared with available wafer treatments. Transmission Electron Microscopy and Scanning Electron Microscopy investigations revealed the main defects in the n-epitaxial silicon are grown-in stacking faults, oxidation-induced stacking faults, and mounds. These defects, notably oxidation-induced stacking faults, cause serious reduction of lifetime. The conclusion reached is significant in terms of the effect of sound stressing wafer backsides before epitaxial deposition on lifetime. This improvement is a result of reduction in defect density.

EXAMPLE 3

The use of this technique in device processing can also be demonstrated in the growth of high quality epitaxial silicon films on implanted nitrogen layers. It has been demonstrated that silicon nitride films can be produced subsurface through high energy implantation of nitrogen and that the silicon layer above the surface remains a single crystal. Device application revealed problems with the lifetime of carriers in this single crystal silicon layer. As a consequence, it has been proposed to grow epitaxial silicon on such implanted crystals to improve the silicon quality; however, difficulties arose in the quality of the epitaxial film. The use of impact sound stressing to improve the lifetimes of epitaxial silicon on the ion-implanted surface can be accomplished after implantation, but before epitaxy. The processing can be summarized by the following steps:

a. high energy implantation of a type described in U.S. Pat. No. 3,622,382, "Semiconductor Isolation Structure and Method of Producing";

b. impact sound stressing of the implanted wafer on the non-implanted wafer side;

c. annealing of the wafer to obtain the silicon-nitride film as described in U.S. Pat. No. 3,622,382; and d. epitaxial deposition.

The following tables show the lifetime of n-epitaxial silicon on As$^+$ implanted substrates, both with and without backside sound stressing.

| Lifetime of N-epitaxial Silicon on As$^+$ Implanted Substrates | | | |
| --- | --- | --- | --- |
| | | | Energy = 80Kev |
| Sample | No. Implant (Half Wafer) Lifetime, $\mu$s | As$^+$ Implant (Half Wafer) Lifetime, $\mu$s | Dose 1 cm$^2$ |
| Standard 127–1 | 0.15 | 0.028 | $10^{13}$ |
| Selected 127–9 | 0.5 | 0.035 | $10^{13}$ |
| Standard 127–5 | 0.37 | 0.251 | $10^{13}$ |
| Selected 127–11 | 1.37 | 0.79 | $10^{14}$ |
| Standard 128–1 | 0.051 | 0.068 | $10^{15}$ |
| Selected 128–9 | 0.76 | 0.94 | $10^{15}$ |
| Standard 128–5 | 4.86 | 2.51 | $10^{16}$ |
| Selected 128–11 | 1.54 | 0.92 | $10^{16}$ |

| Effect of Backside Sound Stressing on Lifetime of N-epitaxial Silicon on As$^+$ Implanted Substrates | | | |
| --- | --- | --- | --- |
| | | | Energy = 80Kev |
| Sample | No. Implant (half wafer) Lifetime, $\mu$s | As$^+$ Implant (half wafer) Lifetime, $\mu$s | Dose 1 cm$^2$ |
| Standard 127–2 | 5.43 | 2.64 | $10^{13}$ |
| Selected 127–10 | 2.57 | 1.63 | $10^{13}$ |
| Standard 127–6 | 2.30 | 1.51 | $10^{14}$ |
| Selected 127–12 | 2.51 | 1.37 | $10^{14}$ |
| Standard 128–2 | 0.47 | 0.13 | $10^{15}$ |
| Selected 128–10 | 2.42 | 0.21 | $10^{15}$ |
| Standard 128–6 | 0.085 | 0.15 | $10^{16}$ |
| Selected 128–12 | 3.48 | 1.39 | $10^{16}$ |

From these examples, it is readily apparent that the application of impact sound stressing results in improved lifetime in the device area. This technique is beneficial to all semiconductor devices, specifically to dynamic memories, bipolars, solar cells and power devices.

While exemplary embodiments have been specifically disclosed, it should be understood that the practice of this invention is not limited to those embodiments. Modifications and variations falling within the spirit of the invention will occur to those skilled in the art. Therefore, it is not intended that the scope of the invention be determined by the disclosed exemplary embodiments, but rather should be determined by the breadth of the appended claims.

What is claimed is:

1. In the process of making semiconductor devices, the improvement comprising the steps of, placing a plurality of loose spherical shaped objects on one face of a semiconductor wafer and acoustically vibrating said wafer whereby said face is damaged in a controlled and uniform manner.

2. The method of claim 1 wherein the wafer is vibrated prior to high temperature processing to fashion the device.

3. The method of claim 1 wherein the wafer is acoustically vibrated at the resonant frequency of the wafer.

4. The method of claim 1 including the steps of cleaning the wafer following acoustical vibration and fabricating an MOS device on the side of the wafer opposite that upon which said spherical shaped objects were placed.

5. The method of claim 4 wherein said MOS device is a capacitor made by deposition of aluminum into said wafer.

6. The method of claim 1 wherein implantation of the wafer occurs prior to acoustical vibration.

7. The method of claim 6 wherein nitrogen is implanted and including the steps of annealing the wafer following acoustical vibration to obtain a silicon nitride film and epitaxial deposition.

8. A method of making improved semiconductor substrates comprising the step of damaging one face of the substrate by vibrating a plurality of loose spherical objects on said face to create a uniform damage pattern having Hertzian fracture cones and micro-splits.

9. The method of claim 8 wherein said vibration is acoustical.

10. The method of claim 9 wherein said acoustical vibration is at the resonant frequency of said wafer.

11. The method of claim 10 wherein said vibration occurs prior to high temperature processing of said substrate.

* * * * *

UNITED STATES PATENT AND TRADEMARK OFFICE
CERTIFICATE OF CORRECTION

PATENT NO. : 4,018,626
DATED : April 19, 1977
INVENTOR(S) : Guenter H. SCHWUTTKE et al It is certified that error appears in the above-identified patent and that said Letters Patent are hereby corrected as shown below:

Column 1, line 25 - delete "imprurities" and insert -- impurities -- line 68 - after "epitaxial" insert -- , --

Column 4, line 59 - delete "(15 Ω cm)" and insert -- (15Ω - cm) -- line 60 - delete "n-eptiaxial" and insert -- n-epitaxial -- line 64 - delete "eteched" and insert -- etched --

Column 5, line 9 - delete "RESULTS"

lines
11-12 - delete both lines

Column 7, line 7 - after "ion-implanted" insert -- silicon --

Column 8, line 9 - delete "inventionbe" and insert -- invention be --

Signed and Sealed this fifth Day of July 1977

[SEAL]

Attest:

RUTH C. MASON
Attesting Officer

C. MARSHALL DANN
Commissioner of Patents and Trademarks